United States Patent
Mehra et al.

(10) Patent No.: US 10,627,883 B2
(45) Date of Patent: Apr. 21, 2020

(54) ONBOARD MONITORING OF VOLTAGE LEVELS AND DROOP EVENTS

(71) Applicant: ADVANCED MICRO DEVICES, INC., Santa Clara, CA (US)

(72) Inventors: Amitabh Mehra, Fort Collins, CO (US); Dana G. Lewis, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 120 days.

(21) Appl. No.: 15/907,744

(22) Filed: Feb. 28, 2018

(65) Prior Publication Data
US 2019/0265767 A1  Aug. 29, 2019

(51) Int. Cl.
| | | |
|---|---|---|
| G06F 1/30 | (2006.01) | |
| G06F 1/32 | (2019.01) | |
| G06F 1/28 | (2006.01) | |
| G06F 1/3206 | (2019.01) | |
| G06F 1/324 | (2019.01) | |

(52) U.S. Cl.
CPC .............. *G06F 1/305* (2013.01); *G06F 1/28* (2013.01); *G06F 1/324* (2013.01); *G06F 1/3206* (2013.01)

(58) Field of Classification Search
CPC ........ G06F 1/305; G06F 1/3206; G06F 1/324; G06F 1/28
See application file for complete search history.

(56) References Cited

U.S. PATENT DOCUMENTS

| | | |
|---|---|---|
| 8,368,385 B2 | 2/2013 | Barton et al. |
| 8,847,777 B2 | 9/2014 | Ramaswami |
| 2009/0063065 A1* | 3/2009 | Weekly .................... G06F 1/28 702/64 |
| 2011/0291630 A1 | 12/2011 | Konstadinidis et al. |
| 2015/0026531 A1 | 1/2015 | Kosonocky et al. |
| 2018/0089052 A1* | 3/2018 | Igarashi ............... G11C 29/025 |

FOREIGN PATENT DOCUMENTS

WO    2016182690 A1    11/2016

OTHER PUBLICATIONS

International Search Report and Written Opinion dated Jun. 12, 2019 for International Application No. PCT/US2019/019783, 12 pages.

* cited by examiner

*Primary Examiner* — Stefan Stoynov

(57) ABSTRACT

A processor includes a plurality of voltage droop detectors positioned at multiple points of a processor. The detectors monitor voltage levels and alert the processor if a droop event has been detected in real time. Multiple droops can be detected simultaneously, with each detected droop event generating an alert that is sent to a processor module, such as a clock control module, to act based on the detected droop. Each detector employs a ring oscillator that generates a periodic signal and a corresponding count based on that signal, where the frequency of the signal varies based on a voltage at the corresponding point being monitored.

18 Claims, 7 Drawing Sheets

FIG. 5

CLOCK COUNT

COUNT TYPE: INCREMENTING
SLOWER CLOCK = HIGHER COUNT

500

402 — CLOCK RUNNING AT 100% FREQUENCY RATE
- COUNT = 1000 (502)
- RESET COUNT (504)
- COUNT = 1000 (502)
- RESET COUNT (504)

404 — CLOCK RUNNING AT REDUCED FREQUENCY RATE
- COUNT = 1500 (506)
- RESET COUNT (504)
- COUNT = 1500 (506)
- RESET COUNT (504)

ONBOARD MONITORING OF VOLTAGE LEVELS AND DROOP EVENTS

BACKGROUND

Description of the Related Art

Modern processor designs continue the trend of drawing more power and increasing circuit density as compared to past designs. These trends place heavier demands on the processor's power budget with less tolerance for noise and other variations, such as changes in voltage levels due to changing processor loads. Above a threshold magnitude, these variations are called voltage "droops". Droops can adversely affect the operation of the processor. For example, droops can cause unwanted effects such as data corruption, logic gates failing to operate, the slowdown of instruction processing, and the failure to properly execute instructions altogether. However, detection and monitoring of voltages and droops in conventional processor designs is relatively inefficient.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 5 is a block diagram of counting the output of a ring oscillator as employed in the droop detectors of FIG. 1 in accordance with some embodiments.

DETAILED DESCRIPTION

Disclosed herein are methods and systems for detecting and monitoring voltages and voltage droops at multiple points of a processor by using one or more voltage/droop detectors (detectors). The detectors are positioned at various points across the processor to monitor voltage levels and to alert the processor if a droop event has been detected in real time. In some embodiments, multiple droops are detected simultaneously, with each detected droop event generating an alert that is sent to a processor module, such as a clock control module, to act based on the detected droop. Each detector employs a ring oscillator that generates a periodic signal and a corresponding count based on that signal, where the frequency of the signal varies based on a voltage at the corresponding point being monitored. Thus, when the input voltage (e.g. the supply voltage being sent to the processor) falls due to a droop event, the ring oscillator's periodic signal decreases in frequency and creates a corresponding change in the count indicative of the droop. The detector also monitors voltage levels and provides an accurate reading of voltage before, during, and after the droop event, allowing the processor to better respond to the droop events.

The detector also employs a compare module that receives a predetermined reference (threshold) value and the count from the ring oscillator. The threshold value is a specified acceptable value, below which the supply voltage is characterized as undergoing a droop event. When the count from the ring oscillator falls below the threshold value, the compare module sends an alert to the processor. The processor then takes any of several remedial actions, including, but not limited to reducing the number of instructions being executed or performing clock stretching to one or more of the system clocks. Furthermore, in some embodiments, the detectors are formed within the processor and are manufactured at the same time and using the same processes as when forming the processor. In yet other embodiments, the counts and alerts from the detector are stored in memory for later analysis. By employing the ring oscillator, the droop detectors support a relatively small circuit footprint. This allows the use of multiple detectors at different points of the processor, thereby enabling more granular responses to droop events, as well as supporting relatively fast detection and amelioration of the droop events.

Figure 1:
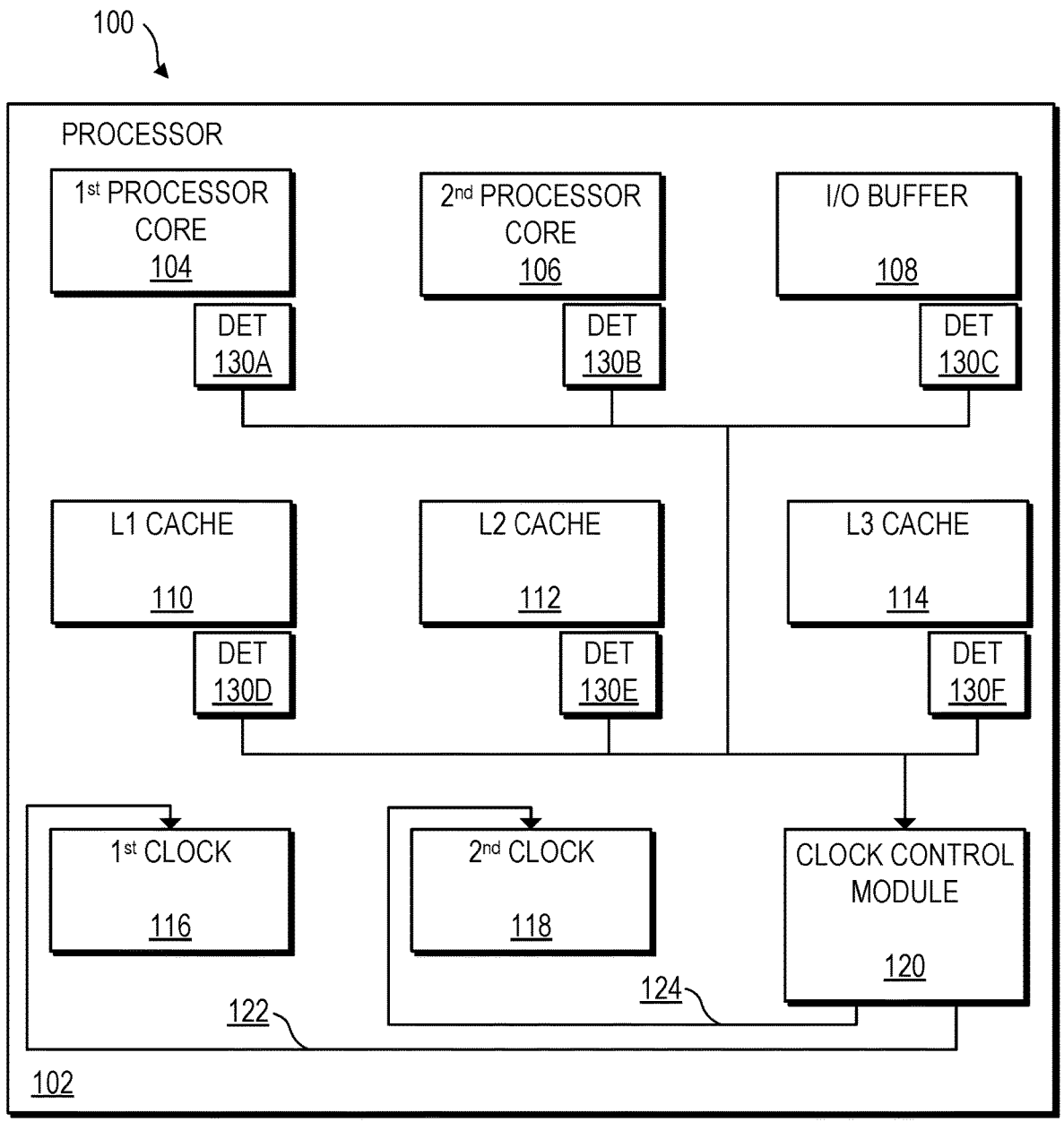
FIG. 1 is a processing system including a processor having a plurality of droop detectors to detect and monitor voltages and voltage droops at different points of the processor in accordance with some embodiments.

FIG. 1 is a processing system 100 including a processor 102 having a plurality of droop detectors to detect and monitor voltages and voltage droops at different points of the processor in accordance with some embodiments. FIG. 1 illustrates the processor 102 having multiple internal modules including, but not limited to, a first processor core 104, a second processor core 106, an input/output (I/O) buffer 108, a level-one (L1) cache (memory) 110, a L2 cache 112, a L3 cache 114, a first reference clock 116, a second reference clock 118, a clock control module 120, and a plurality of droop detectors (detectors) 130A-130F. The processor 102 also includes control lines from the clock control module 120 to each reference clock 116, 118, with a first control line 122 to the first clock 116 and a second control line 124 to the second clock 118. The illustrated modules of processor 102 are representative only and in other embodiments, the processor 102 includes other modules, devices, and circuits.

The processor 102 is generally configured to execute sets of instructions organized in the form of computer programs in order to carry out tasks on behalf of an electronic device. Accordingly, the processor 102 may be used in any of a variety of electronic devices, such as a desktop or laptop computer, server, smartphone, tablet, game console, and the like. The first and second cores 104, 106 execute instructions of the processor, operate independently of each other, have their own clocks, and have the ability to execute different processes, instructions, and I/O signals. The I/O buffer 108 controls input and output signals to and from the modules within the processor 102, as well as signals from outside the processor 102.

The L1, L2, and L3 cache memory 110, 112, 114 are each memory devices generally configured to store data, and therefore may be random access memory (RAM) memory modules, non-volatile memory devices (e.g., flash memory), and the like. The L1, L2, and L3 cache memory 110, 112, 114 store data retrieved from other system memory for later retrieval by the cores 104, 106, and form a memory hierarchy for the processing system 100. In addition, the memory hierarchy of the processor 102 may include other memory modules, such as additional caches not illustrated at FIG. 1.

The first and second reference clocks 116, 118 provide a stable system synchronization signal for the corresponding cores 104, 106 and other modules. The clock control module 120 controls the frequency of the clocks 116, 118. In different embodiments, the clocks 116, 118 operate at the same or different frequencies, and the frequency of each clock signal is reduced ("clock stretching") or increased as directed by the clock control module 120 and based on operating conditions at the processor 102.

The detectors 130A-130F detect a droop event by monitoring the voltage at a point in the processor 102 in real time. In some embodiments, the detectors 130A-130F each include a ring oscillator and a compare module. The detectors 130A-130F use the ring oscillator to detect droop events and, as a result, generate an alert signal that is sent to the processor 102 as described further herein. The ring oscillator generates a stable periodic signal when the power supply voltage and ambient temperatures are stable. When either or both the supply voltage or the temperature changes, the periodic signal of the ring oscillator also changes in direct proportion of the magnitude of the change. The ring oscillator also generates a count that is representative of the duration of a single clock cycle of the ring oscillator's periodic signal. The count is an accurate representation of the voltage levels at the processor 102 as detected by the ring oscillator. The count is also used to monitor the voltage levels during, before, and after a droop event is delivered to the processor 102. In this manner, the voltage levels, as delivered to the processor 102, are measured and quantified in real time, and this data is used by the processor 102 for further analysis. For example, in some embodiments, the data is used to characterize different droop events to support different responses to different types of droop events. The compare module receives the count and generates an alert if the count falls below a predetermined threshold level. During operation, the droop detector monitors the count and sends an alert when the count changes due to changes in the monitored voltage.

Variations in the supply voltage exist as the power is distributed throughout the processor 102. Accordingly, the detectors 130A-130F are positioned within the processor 102 at multiple points to monitor voltage levels at the different points simultaneously. In some embodiments, each of the multiple detectors 130A-130F senses the voltage at a single point, such that droops across the processor 102 as a whole are detected. In yet other embodiments, a single detector 130A is electrically connected to multiple points within the processor 102 to monitor and detect droops in multiple locations.

In some embodiments, the clock control module 120 receives control signals from the detectors 130A-130F and sends signals to the clocks 116, 118 as instructed to begin clock stretching actions whenever a droop event is detected. The clock control module 120 is generally configured to manage the reference clocks 116, 118 of the processor 102 by changing the output frequency of the clocks 116, 118 by using clock stretching techniques. When clock stretching occurs, the clock 116, 118 frequencies are reduced, the power usage of all modules in the processor 102 are also reduced, and the cores 104, 106 execute instructions at a slower rate, further reducing power usage and alleviating the droop event that caused the clock stretching response. In this manner, the droop event is mitigated to minimize adverse effects to the processor 102.

Figure 2:
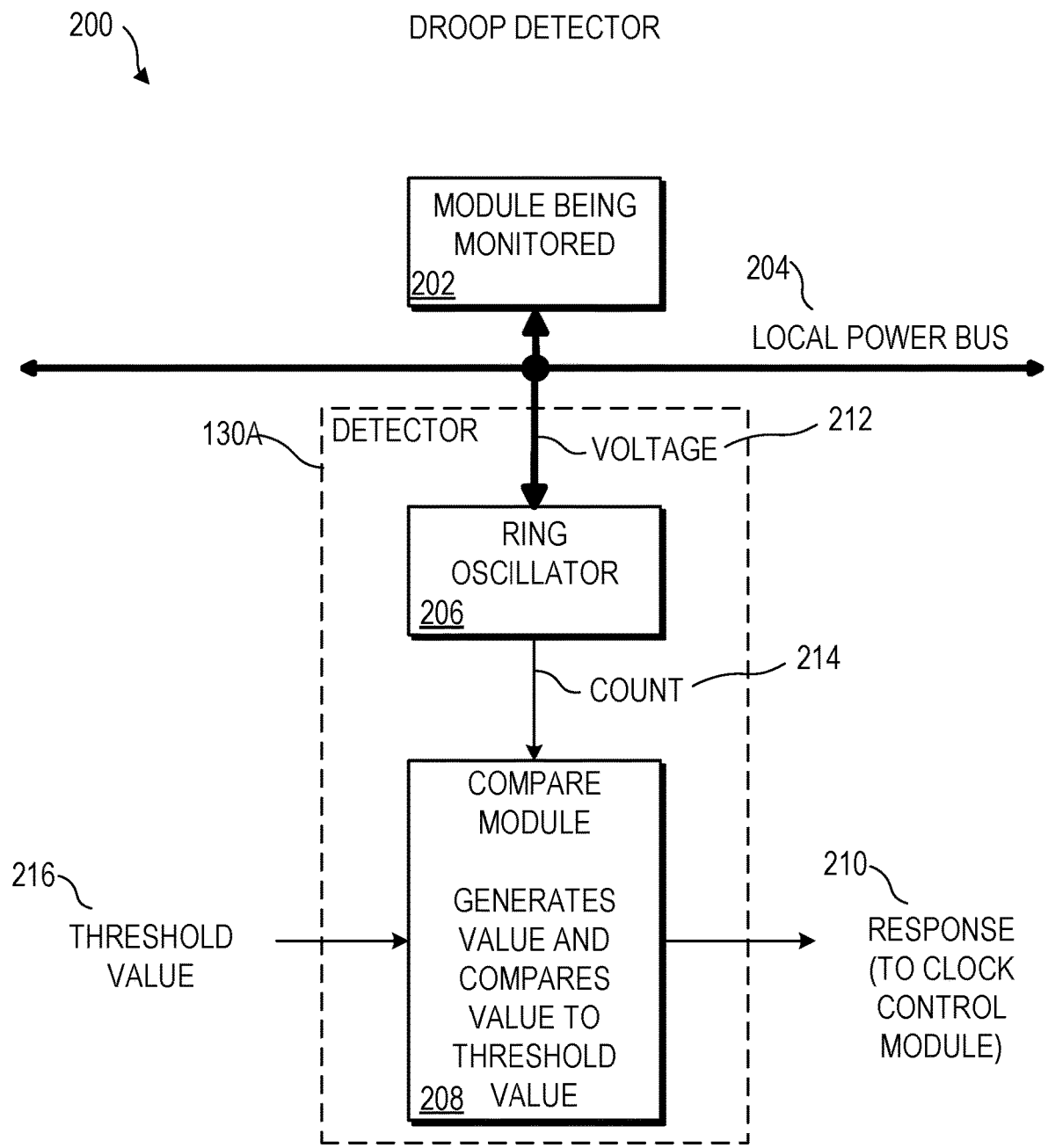
FIG. 2 is a block diagram of the droop detector of FIG. 1 employing a ring oscillator and a compare module to monitor a voltage at a power bus of the processor in accordance with some embodiments.

FIG. 2 is a block diagram of the droop detector 130A of FIG. 1 employing a ring oscillator 206 and a compare module 208 to monitor a voltage 212 at a power bus 204 of the processor 102 in accordance with some embodiments. The detector 130A is electrically connected via the voltage sense line 212 to the local power bus 204 that provides power to the module 202 of the processor 102 of FIG. 1. The module 202 represents a module of the processor 102 where detection of droops is desired, and is a core, cache, I/O buffer, and the like of the processor 102 as described with respect to FIG. 1. In an alternative embodiment, the detector 130A is connected to a power pin to sense the voltage supplied to the module 202. The detector 130A includes the ring oscillator 206 and the compare module 208, which compares the output of the ring oscillator 206 to a threshold value 216 and generates a response 210 that is sent to the clock control module 120 of FIG. 1.

The ring oscillator 206 generates a stable periodic signal when the power supply voltage and ambient temperatures are stable. When either or both the supply voltage or the temperature changes, the periodic signal of the ring oscillator 206 also changes in direct proportion of the magnitude of the change. The ring oscillator 206 generates a count 214, which is a quantitative representation of the frequency of the periodic signal generated by the ring oscillator 206. As an example, the count generated by a 100 MHz ring oscillator (that is, a ring oscillator generating a 100 MHz signal) may be 1000. As the periodic signal of the ring oscillator 206 changes, the corresponding count 214 also changes proportionally. Following the earlier example, if the 100 MHz ring oscillator is now operating at 95 MHz, the count may be 1050. In some embodiments, the count 214 is reset every clock cycle in order to provide a unique count 214 for each individual cycle of the output signal from the ring oscillator 206. Also, in some embodiments, the count 214 increments over time, resulting in an increased count 214 for a slower clock cycle and a decreased count 214 for faster clock cycles. Alternatively, in some embodiments, the count 214 decrements over time, resulting in a larger count 214 for a faster clock cycle and a smaller count 214 for a slower clock cycle. In one embodiment, the detector 130A detects droops of less than 3 millivolts (mV) and 1 nanosecond (ns) in total duration.

The detector 130A also includes the threshold value 216 that is a decimal representation of a predetermined minimum reference frequency. The compare module 208 uses as an input the count 214 from the ring oscillator 206 and compares that decimal value to the input threshold value 216. From these two inputs, the compare module 208 generates the response 210 and sends the response 210 to the clock control module 120 of the processor 102 for further action. In some embodiments, the count 214 is stored in memory for later retrieval by the processor 102.

In operation, the detector 130A monitors the voltage sense line 212. The ring oscillator 206 generates a periodic signal which is quantized and sent to the compare module 208 as the count 214. The compare module 208 also receives the threshold value 216 and compares the two values. During nominal operation (i.e. in the absence of a droop), the count 214 is above the threshold value 216 and the compare module 208 does not generate the response 210. Once a droop condition on the local power bus 204 appears, the periodic signal frequency of the ring oscillator 206 decreases and causes the count 214 to decrease. The compare module 208 compares the count 214 with the threshold value 216, and once the count drops below the threshold value 216, the compare module generates the response 210 that is sent to the clock control module 120. Thus, the detectors 130A-130F monitor the voltage applied to a point on the processor 102 in real time, and provides accurate voltage data before, during, and after a droop event.

In some embodiments, the count 214 is reset every processor clock cycle. When receiving the response 210, the clock control module 120 takes further action, including but not limited to stretching the signals from the first clock 116 and second clock 118, as described herein, or reducing the number of instructions the processor 102 is executing. Other actions are possible, and the examples given are not limiting.

Figure 3:
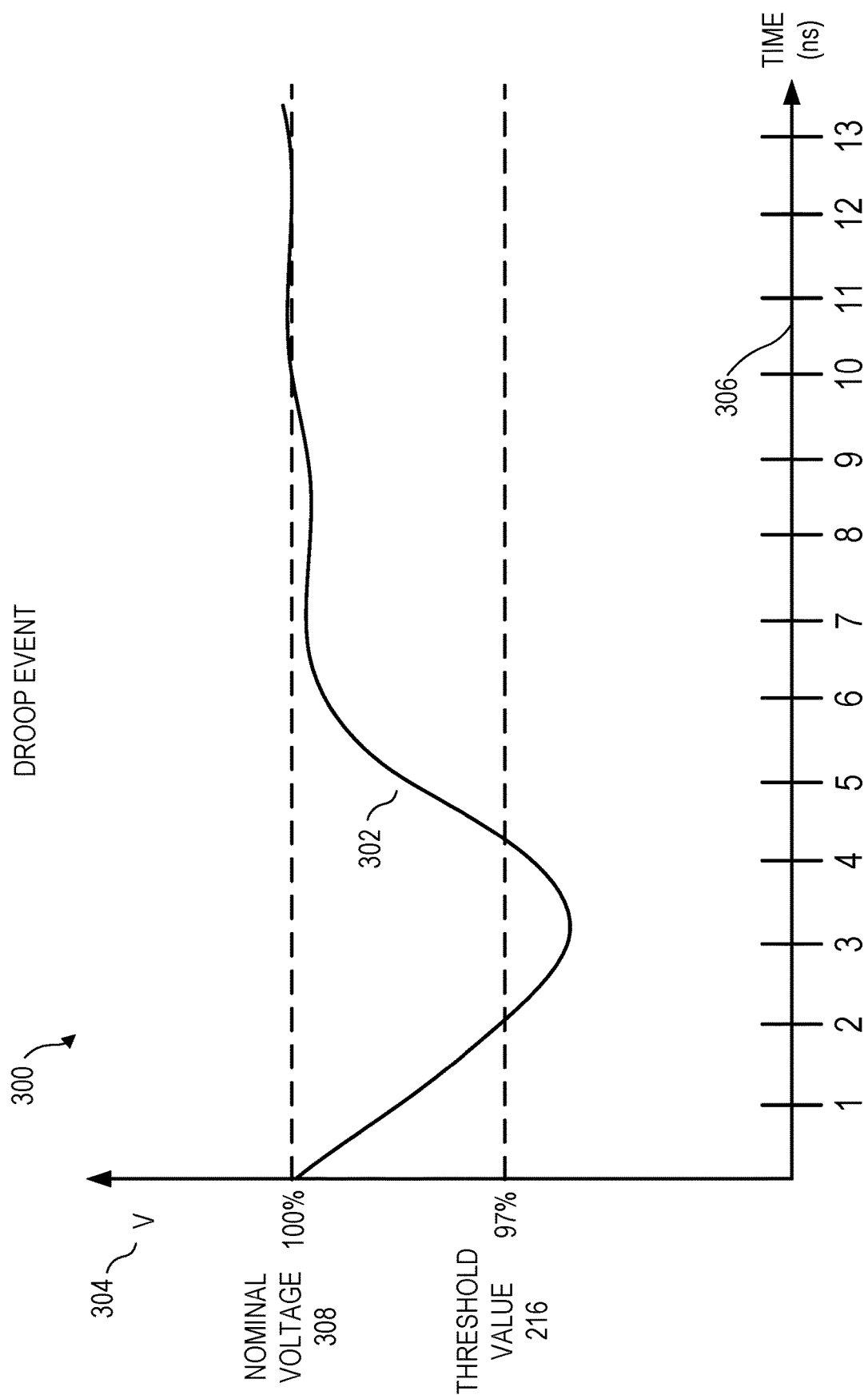
FIG. 3 is a diagram illustrating the detection and monitoring of voltages and a droop event at a point on the processor of FIG. 1 in accordance with some embodiments.

FIG. 3 is a diagram illustrating the detection and monitoring of voltages and a droop event 300 at a point on the processor 102 of FIG. 1 in accordance with some embodiments. The droop event 300 is one example of a droop event, but other droop events are possible, including events with longer or shorter duration or magnitude. The droop event 300 is displayed on the graph with time in nanoseconds (ns) on a horizontal axis 306 and voltage on a vertical axis 304. The graph also displays a 100% nominal voltage 308 reference line and the threshold value 216 reference line (as illustrated at FIG. 2). In FIG. 3, the threshold value 216 is set at 97% of the nominal voltage 308, but other values are possible. The diagram also displays a waveform of a voltage droop 302, with the droop 302 having a duration of approximately 10 ns total and a magnitude exceeding 3% below the nominal voltage level 308 for approximately 3 ns, and a return to nominal voltage 308 over the next 5 ns. As described with respect to FIG. 1, droop events as short as 1 ns and 50 mV in magnitude creates adverse effects in the operation of the processor 102 such as missed instructions and module malfunctions. The detector 130A as illustrated at FIG. 2 is used to detect and monitor droops such as droop event 300 and sends the response 210 to the clock control module 120 as illustrated in FIG. 2.

Figure 4:
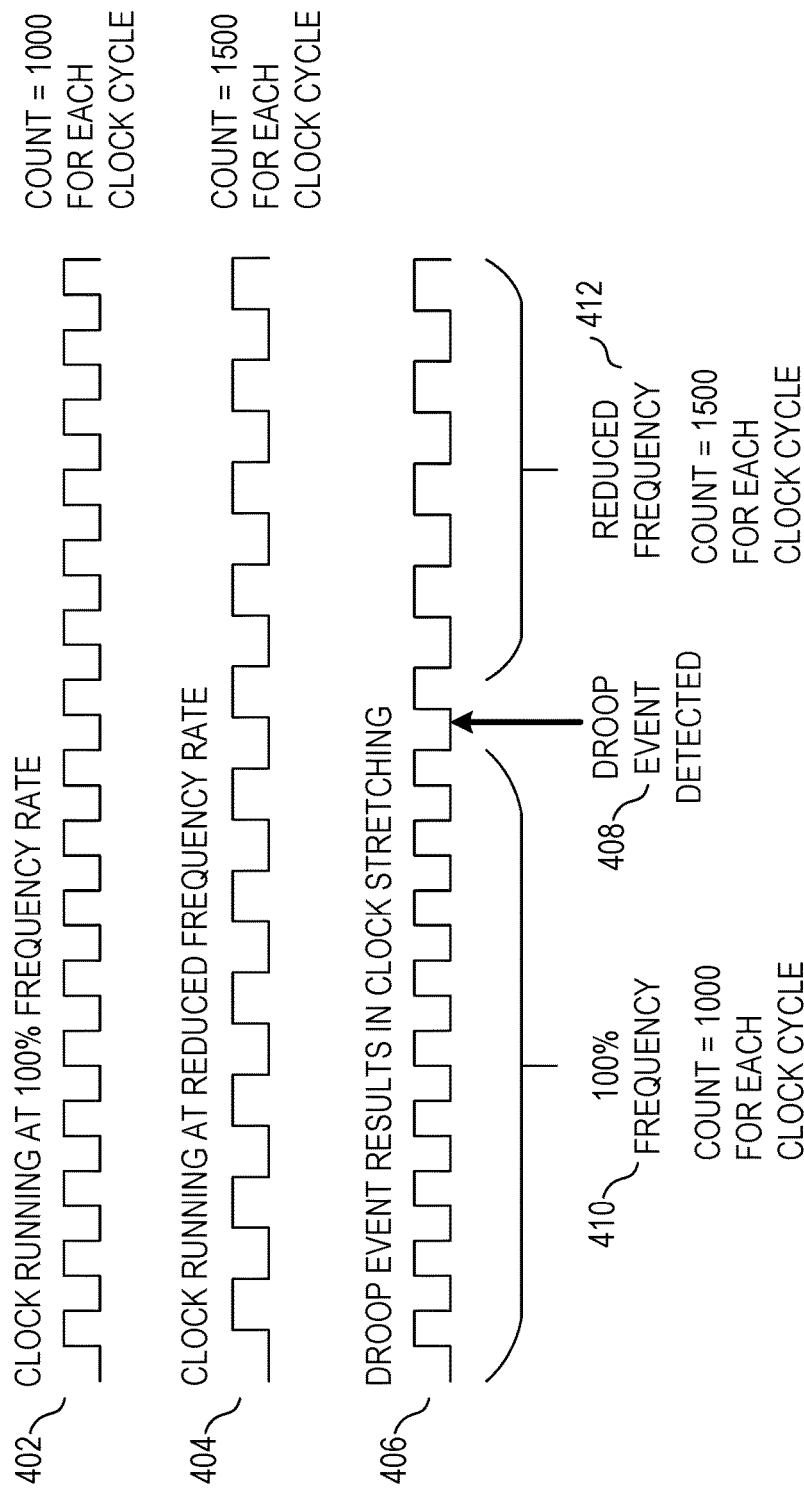
FIG. 4 is a diagram illustrating clock and clock stretching signals at the processor of FIG. 1 in accordance with some embodiments.

FIG. 4 is a diagram illustrating clock and clock stretching signals 400 at the processor 102 of FIG. 1 in accordance with some embodiments. The signals 400 include a clock signal 402 of a clock running at a 100% frequency level. In this example, clock signal 402 is a square wave with the count 214 of 1000. Meanwhile, clock signal 404 illustrates a clock running at a reduced frequency rate (e.g. a clock running at 75% of a nominal frequency) as compared to the 100% frequency rate of clock signal 402. The resultant count 214 of the reduced rate clock signal 404 is 1250, with the count 214 incrementing over time, thus forming the count 214 that increases as the frequency rate decreases. The reduced-rate clock signal 404 is also termed "clock stretching" as the clock signal 404 is slowed down from the original clock signal 402 as described herein. A hybrid clock signal 406 is an example of clock stretching a system clock and illustrates a clock signal that transitions from a nominal rate (e.g. clock signal 402) to a reduced rate (e.g. clock signal 404). The hybrid clock signal 406 undergoes a smooth transition from one frequency to another without interruptions or spurious noise. In some embodiments, the hybrid clock signal 406 is formed as a result of the detector 130A detecting and monitoring a droop event as illustrated in FIG. 2 and generating the response 210 to the clock control module 120, where the clock control module 120 generates the first control line 122 to reduce the first clock 116 frequency rate.

FIG. 5 is a block diagram of counting the output of a ring oscillator 500 as employed in the droop detectors 130A-130F of FIG. 1 in accordance with some embodiments. FIG. 5 includes a graph of the clock signal 402 of FIG. 4 running at a 100% frequency rate and the stretched clock signal 404 of FIG. 4 running at a reduced frequency rate. For a given cycle, the detector 130A of FIG. 1 generates the count 214 that represents the frequency of the clock as described in FIG. 4. In at least one embodiment, the count 214 is incremented as the single clock cycle is active resulting in a higher count 214 for lower frequencies. In other embodiments, the count 214 is decremented from a given value and results in a smaller count 214 for lower frequencies. For the clock signal 402, the count 502 of one cycle is 1000, with the count reset 504 at the end of the clock cycle. The count continues for each clock cycle, resulting, in this example, in a continuous flow of data starting at 0 and incrementing to 1000 and then being reset and repeating as the clock continues to operate. For the reduced clock signal 404, the count 506 is 1500. This results in a continuous flow of data starting at 0 and incrementing to 1500 and then being reset to 0 and then starting to be incremented again. In some embodiments, the count 214 may begin at an arbitrary number and then decrement for as long as the clock signal is active.

Figure 6:
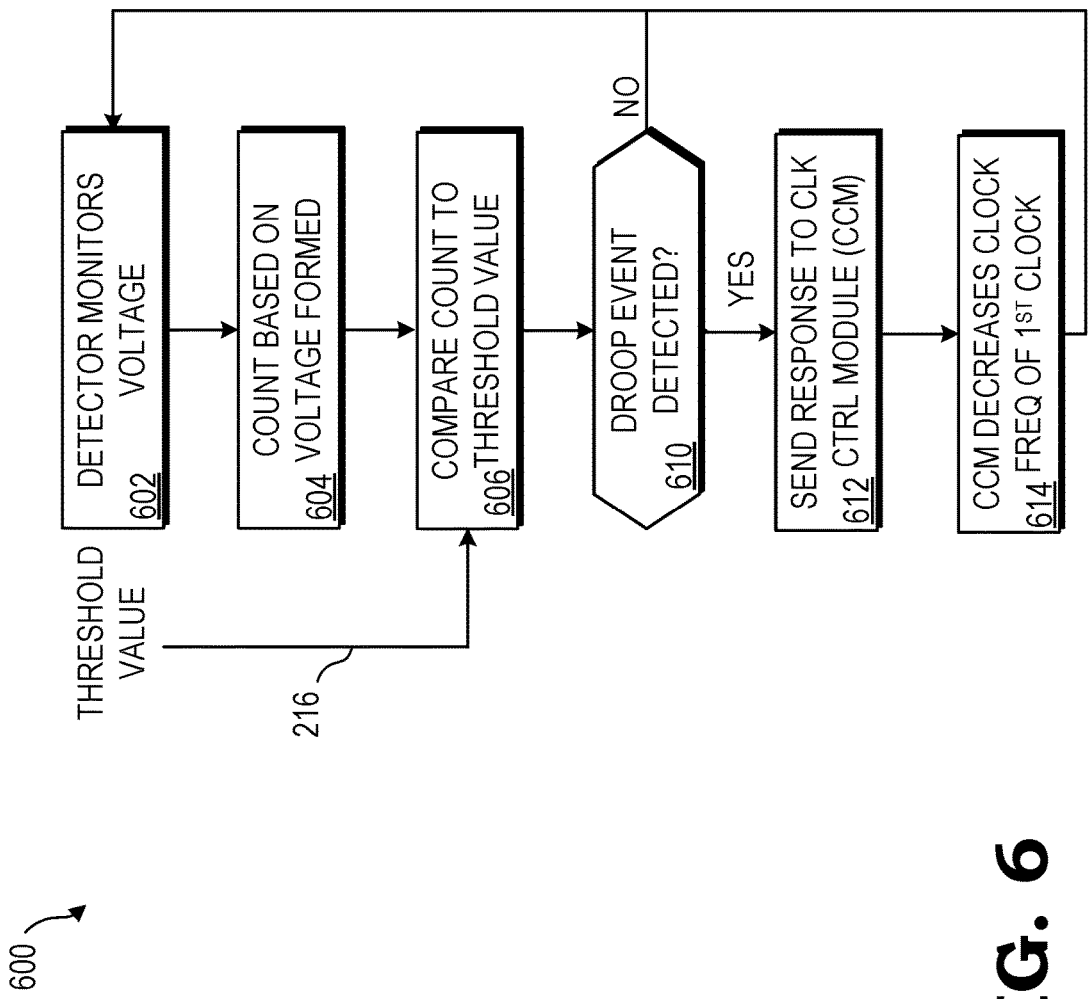
FIG. 6 is a flow diagram illustrating a method for monitoring a droop event of a processor in accordance with some embodiments.

FIG. 6 is a flow diagram illustrating a method 600 for monitoring a droop event 300 of a processor 102 of FIG. 1 in accordance with some embodiments. The method 600 includes, at block 602, a single droop detector 130A monitoring voltage at the processor 102 as described in FIG. 1. In this embodiment, there is a single detector 130A being used to monitor the voltage supplied to one point in the processor 102. The flow diagram continues at block 604, where the detector 130A generates the count 214 based on the voltage sensed by using the ring oscillator 206 and the compare module 208 as described in FIG. 2. The count 214 is a digital representation of the output of the ring oscillator 206. The output of the ring oscillator 206 will change with changes in input voltage or temperature, and thus results in changes in the count 214. Next, at block 606, the compare module 208 accepts as inputs the count 214 and the threshold value 216 to determine whether the two values match or are different, and if different, calculates the magnitude of the difference. Next, at decision block 610, the compare module decides whether the count 214 exceeds the threshold value 216, and by what magnitude. In this manner, the detector 130A senses a droop event. If the decision at block 610 is "No", the flow cycles back to the beginning block 602. If, however, the decision at block 610 is "Yes", a droop event has been detected and the method 600 continues with block 612. At block 612, the compare module 208 generates the response 210 and sends the response 210 to the clock control module 120 of the processor 102 for further action. Finally, at block 614, the clock control module 120 reduces the clock frequency of the first clock 116 to limit power usage and to minimize the effects of the droop event.

Figure 7:
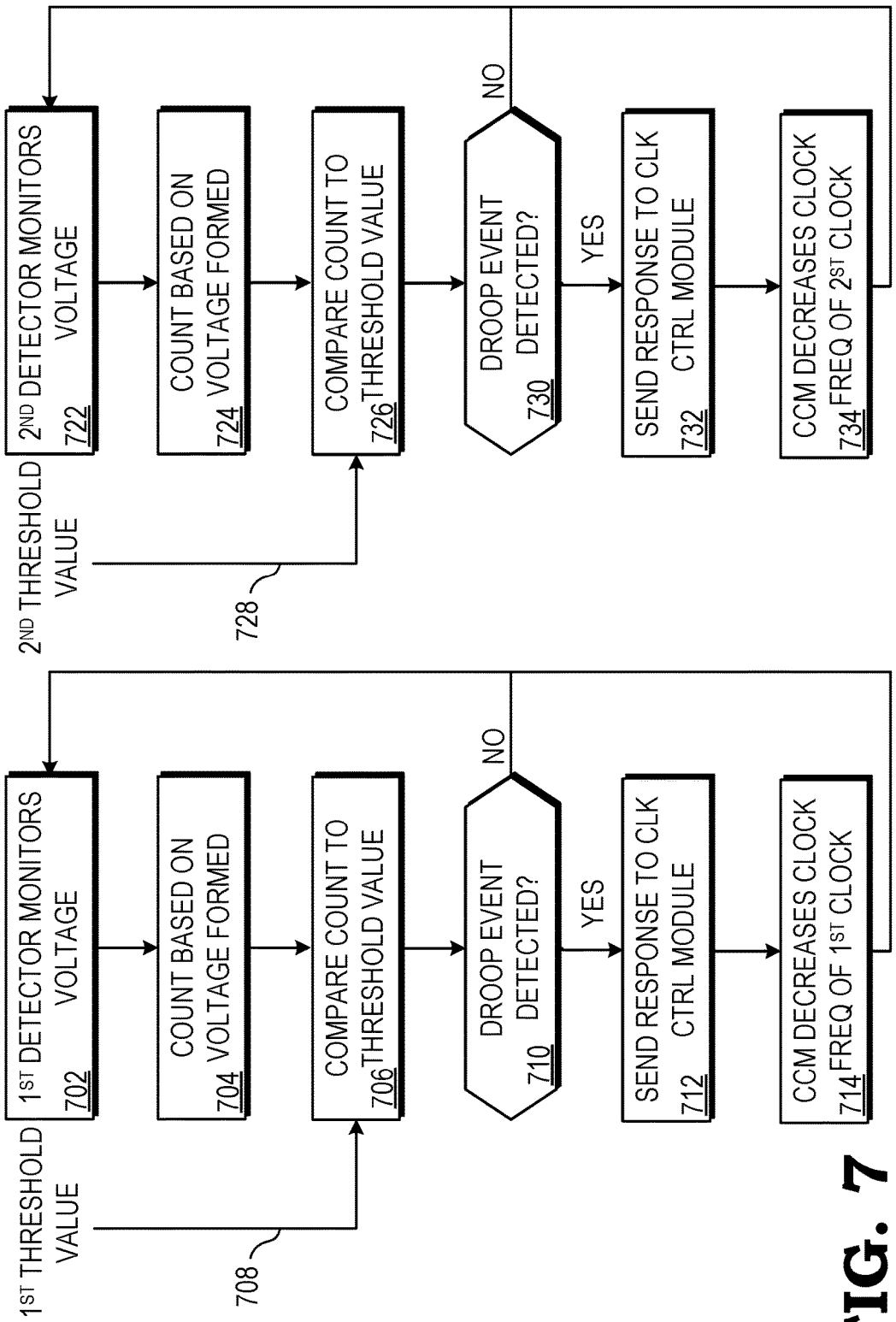
FIG. 7 is a flow diagram illustrating a method for simultaneously monitoring droop events at multiple points of a processor in accordance with some embodiments.

FIG. 7 is a flow diagram illustrating a method 700 for simultaneously monitoring droop events 300 at multiple points of a processor 102 of FIG. 1 in accordance with some embodiments. The method 700 is similar to the method 600 described above but uses multiple detectors 130A-130F for monitoring multiple points of the processor 102 simultaneously. Additionally, the method 700 employs multiple responses that could affect, for example, different system clocks or different modules within the processor 102.

The method 700 includes, at block 702, a single droop detector 130A monitoring voltage at the processor 102 as described in FIG. 1. The flow diagram continues at block 704, where the detector 130A generates the count 214 based on the voltage sensed by using the ring oscillator 206 and the compare module 208 as described in FIG. 2. The count 214 is a digital representation of the output of the ring oscillator 206. The output of the ring oscillator 206 will change with changes in input voltage or temperature, and thus results in changes in the count 214. Next, at block 706, the compare module 208 accepts as inputs the count 214 and a first threshold value 708 to determine whether the two values match or are different, and if different, calculates the magnitude of the difference. Next, at decision block 710, the compare module decides whether the count 214 exceeds the first threshold value 708, and by what magnitude. In this manner, the detector 130A senses a droop event. If the decision at block 710 is "No", the flow cycles back to the beginning block 702. If, however, the answer is "Yes", a droop event has been detected and the method 700 continues with block 712. At block 712, the compare module 208 generates the response 210 and sends the response 210 to the clock control module 120 of the processor 102 for further action. Finally, at block 714, the clock control module 120 reduces the clock frequency of the first clock 116 to limit power usage and to minimize the effects of the droop event.

In a similar manner as blocks 702, 704, 706, 710, 712, and 714 as described above, a second detector monitors a separate point in the processor 102 simultaneously with the first detector. The method 700 continues at block 722, a single droop detector 130A monitoring voltage at the processor 102 as described in FIG. 1. The flow diagram continues at block 724, where the detector 130A generates the count 214 based on the voltage sensed by using the ring oscillator 206 and the compare module 208 as described in FIG. 2. The count 214 is a digital representation of the output of the ring oscillator 206. The output of the ring oscillator 206 will change with changes in input voltage or temperature, and thus results in changes in the count 214. Next, at block 726, the compare module 208 accepts as inputs the count 214 and a second threshold value 728 to determine whether the two values match or are different, and if different, calculates the magnitude of the difference. Next, at decision block 730, the compare module decides whether the count 214 exceeds the first threshold value 728, and by what magnitude. In this manner, the detector 130A senses a droop event. If the decision at block 730 is "No", the flow cycles back to the beginning block 722. If, however, the answer is "Yes", a droop event has been detected and the method 700 continues with block 732. At block 732, the compare module 208 generates the response 210 and sends the response 210 to the clock control module 120 of the processor 102 for further action. Finally, at block 734, the clock control module 120 reduces the clock frequency of the second clock 118 to limit power usage and to minimize the effects of the droop event.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   monitoring, by a first detector, a first voltage level at a first point of a processor, wherein the first detector comprises a first ring oscillator, and wherein the first detector generates a first count indicative of the first voltage level;
   comparing the first count to a first predetermined threshold value to detect a first voltage droop condition;
   adjusting a frequency of a first clock signal in response to detecting the first voltage droop condition; and
   adjusting a frequency of a second clock signal in response to detecting the first voltage droop condition.

2. The method of claim 1, wherein adjusting the frequency of the second clock signal comprises adjusting the frequency of the second clock signal by a magnitude different than adjusting the first clock frequency.

3. The method of claim 1, further comprising adjusting a number of operations the processor is executing per cycle in response to detecting the first voltage droop condition.

4. The method of claim 1, further comprising:
   monitoring, by a second detector, a second voltage level at a second point of the processor, wherein the second detector comprises a second ring oscillator, and wherein the second detector generates a second count indicative of the second voltage level;
   comparing the second count to a second predetermined threshold value to detect a second voltage droop condition; and
   adjusting a frequency of the second clock signal in response to detecting the second voltage droop condition.

5. The method of claim 4, wherein the first threshold value is different from the second threshold value.

6. The method of claim 4, wherein adjusting the frequency of the second clock signal comprises adjusting the frequency of the second clock signal by a magnitude different than adjusting the first clock frequency.

7. A method comprising:
   monitoring, by a plurality of detectors, voltage levels at a plurality of points on a processor, wherein each detector comprises a ring oscillator, and wherein each detector generates a count indicative of the corresponding voltage level;
   comparing the counts to a plurality of predetermined threshold values to detect a first voltage droop condition; and
   adjusting frequencies of a plurality of clocks based on the first voltage droop condition.

8. The method of claim 7, wherein the detectors adjust the frequencies of different ones of the plurality of clocks by different magnitudes.

9. The method of claim 7, further comprising:
comparing the counts to the plurality of predetermined threshold values to detect a second voltage droop condition; and
adjusting frequencies of the plurality of clocks based on the second voltage droop condition.

10. The method of claim 7, further comprising reducing a number of operations the processor is executing based on the comparing.

11. A monitoring system comprising:
a first detector positioned at a first point on a processor, wherein the first detector monitors a first voltage level, and wherein the first detector comprises a first ring oscillator, and wherein the first detector generates a first count indicative of the first voltage level;
a first compare module that compares the first count with a first predetermined threshold value to detect a first voltage droop condition; and
a first clock control module, wherein the first clock control module adjusts a frequency of a first clock signal and a second clock signal in response to the first compare module detecting the first voltage droop condition.

12. The monitoring system of claim 11, wherein the first clock control module adjusts the frequency of the second clock signal by a magnitude different than the first clock frequency.

13. The monitoring system of claim 11, wherein the processor adjusts a number of operations the processor is executing per cycle in response to the first compare module detecting the first voltage droop condition.

14. The monitoring system of claim 11, further comprising:
a second detector positioned at a second point on a processor, wherein the second detector monitors a second voltage level, and wherein the second detector comprises a second ring oscillator, and wherein the second detector generates a second count indicative of the second voltage level;
a second compare module that compares the second count with a second predetermined threshold value to detect a second voltage droop condition; and
a second clock control module, wherein the second clock control module adjusts a frequency of a second clock signal.

15. The monitoring system of claim 14, wherein the first threshold value is different from the second threshold value.

16. The monitoring system of claim 14, wherein the second clock control module adjusts the frequency of the second clock signal by a magnitude different than the first clock control module adjusts the frequency of the first clock signal.

17. The monitoring system of claim 14, wherein the first clock signal is provided to a processor core of the processor and the second clock signal is provided to a cache of the processor.

18. The monitoring system of claim 14, wherein the processor reduces a number of operations the processor is executing in response to the second compare module detecting the second voltage droop condition.

* * * * *